(12) United States Patent
Oishibashi et al.

(10) Patent No.: US 9,735,340 B2
(45) Date of Patent: Aug. 15, 2017

(54) METHOD OF MANUFACTURING AN ELECTRONIC COMPONENT

(71) Applicant: MURATA MANUFACTURING CO., LTD., Nagaokakyo-Shi, Kyoto-fu (JP)

(72) Inventors: Hidekazu Oishibashi, Nagaokakyo (JP); Yuichiro Nagamine, Nagaokakyo (JP); Takeo Sato, Nagaokakyo (JP)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 873 days.

(21) Appl. No.: 14/036,171

(22) Filed: Sep. 25, 2013

(65) Prior Publication Data

US 2014/0028155 A1    Jan. 30, 2014

Related U.S. Application Data

(63) Continuation of application No. PCT/JP2012/052228, filed on Feb. 1, 2012.

(30) Foreign Application Priority Data

Apr. 11, 2011  (JP) .................................. 2011-087379

(51) Int. Cl.
     *H01L 41/107*    (2006.01)
     *H01L 41/23*     (2013.01)
     (Continued)

(52) U.S. Cl.
     CPC ............ *H01L 41/107* (2013.01); *H01L 21/50* (2013.01); *H01L 21/52* (2013.01); *H01L 23/08* (2013.01);
     (Continued)

(58) Field of Classification Search
     CPC ......... H01L 21/50; H01L 21/52; H01L 23/08; H01L 23/10; H01L 2924/00;
     (Continued)

(56) References Cited

U.S. PATENT DOCUMENTS

| | | | | |
|---|---|---|---|---|
| 2003/0111437 A1* | 6/2003 | Barber | ..................... | H01L 21/50 216/2 |
| 2005/0109455 A1* | 5/2005 | Bai | ......................... | H01L 23/10 156/292 |
| 2007/0018301 A1* | 1/2007 | Fukuda | ................... | H01L 21/50 257/686 |

FOREIGN PATENT DOCUMENTS

| | | |
|---|---|---|
| EP | 0 089 044 A2 | 9/1983 |
| JP | H06-268091 A | 9/1994 |

(Continued)

OTHER PUBLICATIONS

International Search Report and Written Opinion of PCT/JP2012/052228, date of mailing Apr. 17, 2012.

*Primary Examiner* — A. Dexter Tugbang
(74) *Attorney, Agent, or Firm* — Arent Fox LLP

(57) ABSTRACT

A method for manufacturing an electronic component is provided where resin adhesive rarely spreads before curing. The method includes providing a first sealing member and forming a frame-shaped glass layer on a principal surface of the first sealing member. Moreover, the first sealing member is cut into multiple first sealing members and second sealing members are bonded with resin adhesive to inner frame regions on the principal surface of the first sealing member defined by the glass layer.

6 Claims, 5 Drawing Sheets

(51) Int. Cl.
   *H01L 41/09* (2006.01)
   *H01L 41/293* (2013.01)
   *H01L 21/52* (2006.01)
   *H01L 23/08* (2006.01)
   *H01L 23/00* (2006.01)
   *H01L 21/50* (2006.01)
   *H01L 23/10* (2006.01)
   *H03H 9/10* (2006.01)
   *H01L 41/22* (2013.01)

(52) U.S. Cl.
   CPC .............. *H01L 23/10* (2013.01); *H01L 24/94* (2013.01); *H01L 41/09* (2013.01); *H01L 41/22* (2013.01); *H01L 41/23* (2013.01); *H01L 41/293* (2013.01); *H03H 9/1021* (2013.01); *H01L 2924/0002* (2013.01); *Y10T 29/42* (2015.01); *Y10T 29/4913* (2015.01); *Y10T 29/49126* (2015.01); *Y10T 29/49169* (2015.01); *Y10T 156/1062* (2015.01)

(58) Field of Classification Search
   CPC ..... H01L 2924/0001; H01L 2924/0002; H01L 41/09; H01L 41/107; H01L 41/22; H01L 41/23; H01L 41/293; H01L 24/94; H03H 9/1021; Y10T 156/1062; Y10T 29/42; Y10T 29/49126; Y10T 29/4913; Y10T 29/49169
   See application file for complete search history.

(56) References Cited

FOREIGN PATENT DOCUMENTS

| JP | 09-246867 A | | 9/1997 |
|---|---|---|---|
| JP | H10-154764 A | | 6/1998 |
| JP | 2003163342 A | * | 6/2003 |
| JP | 2003-282766 A | | 10/2003 |
| JP | 2008-112886 A | | 5/2008 |

* cited by examiner

… (US 9,735,340 B2)

METHOD OF MANUFACTURING AN ELECTRONIC COMPONENT

CROSS REFERENCE TO RELATED APPLICATIONS

The present application is a continuation of PCT/JP2012/052228 filed Feb. 1, 2012, which claims priority to Japanese Patent Application No. 2011-087379, filed Apr. 11, 2011, the entire contents of each of which are incorporated herein by reference.

FIELD OF THE INVENTION

The present invention relates to an electronic component having a sealed structure, and to a manufacturing method for the electronic component. More specifically, the present invention relates to an electronic component in which an electronic component body is provided in a sealed space, and to a manufacturing method for the electronic component.

BACKGROUND OF THE INVENTION

Various electronic components that require a sealed structure, for example, a piezoelectric vibration component including a piezoelectric vibration element, have hitherto been used. In such an electronic component having a sealed structure, the sealed structure is generally formed by bonding a sealing member, such as a cap or a lid, to a case member on a substrate with an adhesive. For example, the following Patent Document 1 discloses an electronic component in which a laminated ceramic package and a sealing cap are resin-sealed by an epoxy resin adhesive.

Patent Document 1: Japanese Unexamined Patent Application Publication No. 9-246867

However, in an electronic component in which a sealing member is bonded with a resin adhesive, the resin adhesive spreads sideward before curing. At this time, if the resin adhesive spreads to a peripheral edge portion of the electronic component, the spread resin adhesive adheres to a mounting electrode of a substrate, and this sometimes makes it impossible to form a solder fillet at the time of mounting. As a result, mount failure of the electronic component is apt to occur.

SUMMARY OF THE INVENTION

An object of the present invention is to provide an electronic component in which sealing members are bonded with a resin adhesive and the resin adhesive rarely spreads before curing, and a manufacturing method for an electronic component in which a resin adhesive rarely spreads before curing.

An electronic component according to the present invention includes a first sealing member having a principal surface, a second sealing member bonded to the principal surface of the first sealing member to form a sealed space with the principal surface of the first sealing member, a resin adhesive layer that bonds the first sealing member and the second sealing member in a frame-shaped bonding region on the principal surface of the first sealing member, a frame-shaped glass layer provided between an outer peripheral line of the frame-shaped bonding region and a peripheral edge portion of the principal surface of the first sealing member on the principal surface of the first sealing member, and an electronic component body provided in the sealed space.

According to a specific aspect of the electronic component of the present invention, the frame-shaped glass layer is provided in contact with the outer peripheral line of the frame-shaped bonding region. In this case, the spread of the resin adhesive before curing can be suppressed further.

According to another aspect of the electronic component of the present invention, a thickness of the frame-shaped glass layer is more than a thickness of the resin adhesive layer. In this case, the spread of the resin adhesive before curing can be further suppressed by a difference between the thickness of the frame-shaped glass layer and the thickness of the resin adhesive layer.

According to a further aspect of the electronic component of the present invention, the first sealing member is formed by an alumina substrate. In this case, since a surface of the alumina substrate is rough, there is a great difference between the surface roughness of the alumina substrate and the surface roughness of the frame-shaped glass layer. For this reason, when the alumina substrate is used, the spread of the resin adhesive before curing can be more effectively suppressed by providing the frame-shaped glass layer.

A manufacturing method for the electronic component according to the present invention includes a step of preparing an original sealing member to be cut into a plurality of the first sealing members in a later step, a step of forming the glass layer in a frame shape on a part of a principal surface of the original sealing member, a step of obtaining the plurality of the first sealing members by cutting the original sealing member so that cut sections include portions where the frame-shaped glass layer is provided, and a step of bonding the second sealing member in a frame defined by the frame-shaped glass layer on the principal surface of each of the first sealing members with the resin adhesive before or after cutting. In the manufacturing method of the present invention, the first sealing member in which the frame-shaped glass layer is provided between an outer peripheral line of a frame-shaped bonding region and a peripheral edge portion of the principal surface of the first sealing member can be efficiently obtained by cutting the original sealing member after the glass layer is formed in a frame shape on the part of the principal surface of the original sealing member. Therefore, the electronic component of the present invention can be manufactured efficiently.

According to the electronic component of the present invention, the frame-shaped glass layer is provided between the outer peripheral line of the frame-shaped bonding region and the peripheral edge portion of the principal surface of the first sealing member on the principal surface of the first sealing member. Hence, the surface roughness of a section where the frame-shaped glass layer is provided is low. For this reason, the resin adhesive rarely spreads to the peripheral edge portion of the first sealing member because of the surface tension thereof. Therefore, it is possible to provide an electronic component in which a resin adhesive rarely spreads before curing.

DETAILED DESCRIPTION OF THE PREFERRED EMBODIMENTS

The present invention will become apparent from the following description of a specific embodiment of the present invention with reference to the drawings.

Figure 1:
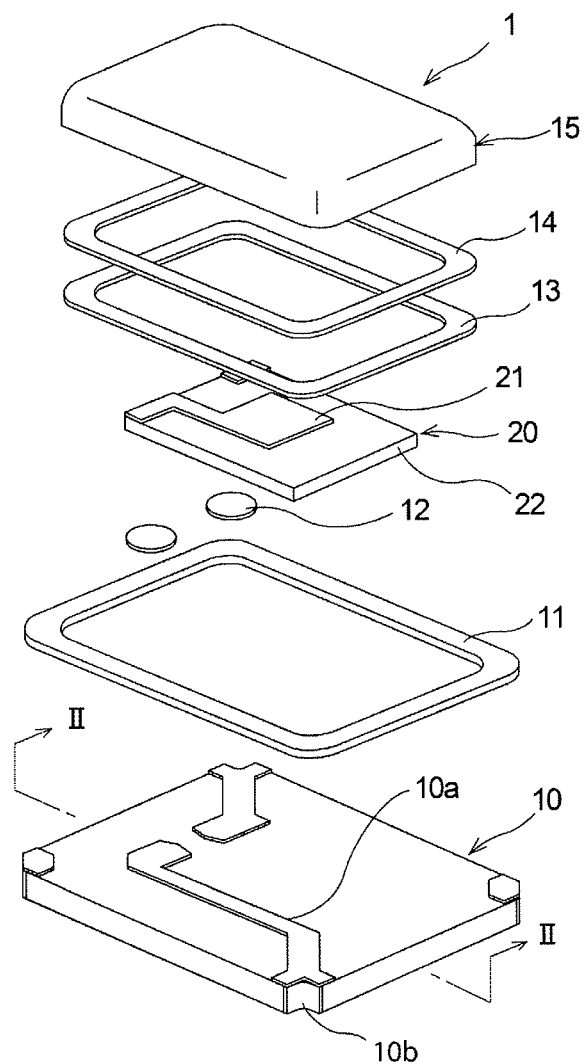
FIG. 1 is a schematic exploded perspective view of an electronic component according to an embodiment of the present invention.
Figure 2:
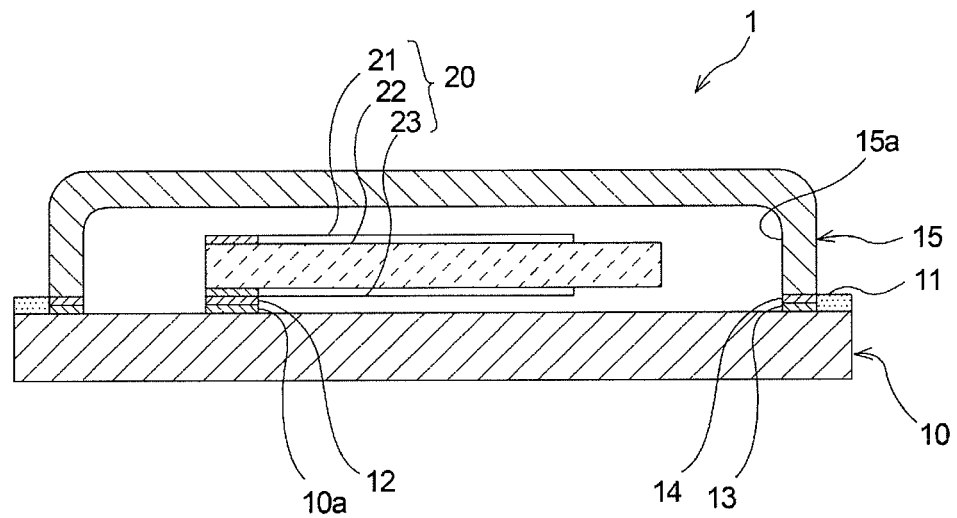
FIG. 2 is a schematic sectional view taken along line II-II of FIG. 1.

FIG. 1 is a schematic exploded perspective view of an electronic component 1 according to an embodiment. FIG. 2 is a schematic sectional view, taken along line II-II of FIG. 1.

As illustrated in FIG. 1, the electronic component 1 includes first and second sealing members 10 and 15. Specifically, the second sealing member 15 is bonded in a frame-shaped bonding region on an inner side of a peripheral edge portion of the first sealing member 10 on a principal surface of the first sealing member 10. Thus, the first and second sealing members 10 and 15 form a sealed space 15a.

In the embodiment, the first sealing member 10 is formed by a plate-shaped alumina substrate, and the second sealing member 15 is formed by a metal cap having an opening that opens downward. However, the shapes of the first and second sealing members 10 and 15 are not particularly limited as long as they can form the sealed space 15a. For example, the first and second sealing members 10 and 15 can be formed of metal, a ceramic material, or resin. Alternatively, the first sealing member 10 may be shaped to have an opening that opens upward, and the second sealing member 15 may be shaped like a plate. Further alternatively, both the first and second sealing members 10 and 15 may be shaped to be joined at edges of openings.

The first and second sealing members 10 and 15 may also have a function other than the function of forming the sealed space 15a. In the embodiment, the first sealing member 10 also has a function that allows a below-described electronic component body 20 to be mounted thereon and that leads an electrode of the electronic component body 20 to the outside.

The first and second sealing members 10 and 15 are bonded with a resin adhesive layer 13 in the above-described frame-shaped bonding region. A resin adhesive that forms the resin adhesive layer 13 is not particularly limited as long as it can bond the first and second sealing members 10 and 15. The resin adhesive layer 13 may use thermosetting resin, or may use photocurable resin. For example, the resin adhesive layer 13 can be formed of an adhesive of resin such as epoxy resin, silicon resin, urethane resin, or imide resin.

Between the resin adhesive layer 13 and the second sealing member 15, a frame-shaped isolating layer 14 is provided. The isolating layer 14 isolates the first and second sealing members 10 and 15. Since the second sealing member 15 has conductivity in the embodiment, the isolating layer 14 is preferably provided. However, when the second sealing member 15 has insulation properties, the isolating layer 14 is not an essential constituent member, and may be omitted. For example, the isolating layer 14 can be formed of resin such as epoxy resin, silicon resin, urethane resin, or imide resin, or metal oxide.

On the principal surface of the first sealing member 10, a frame-shaped glass layer 11 is provided between an outer peripheral line of the frame-shaped bonding region, where the second sealing member 15 is bonded, and a peripheral edge portion of the principal surface of the first sealing member 10. The surface roughness of the frame-shaped glass layer 11 is preferably less than the surface roughness of the first sealing member 10. For example, the glass layer 11 can be formed of glass containing silicon oxide or zinc oxide. For example, the glass layer 11 may be formed of semicrystalline glass.

The thickness of the frame-shaped glass layer 11 is preferably more than the thickness of the resin adhesive layer 13. In this case, the difference between the thickness of the frame-shaped glass layer 11 and the thickness of the resin adhesive layer 13 can effectively suppress the spread of the resin adhesive layer 13 before curing.

In the sealed space 15a, the electronic component body 20 is provided. In the embodiment, the electronic component body 20 is mounted on the first sealing member 10.

In the embodiment, the electronic component body 20 is formed by a piezoelectric vibrator. However, in the present invention, the electronic component body 20 does not always need to be a piezoelectric vibrator. For example, the electronic component body 20 may be an elastic wave element such as a surface acoustic wave element.

In the embodiment, the electronic component body 20 includes a piezoelectric substrate 22 and a pair of electrodes 21 and 23. Specifically, the electrode 21 is provided on an upper surface of the piezoelectric substrate 22, and the electrode 23 is provided on a lower surface of the piezoelectric substrate 22 to be opposed to the electrode 21. The electrode 21 is led out to the lower surface via a side surface of the piezoelectric substrate 22. Voltage can be applied from this pair of electrodes 21 and 23 to the piezoelectric substrate 22. The electrodes 21 and 23 can be formed of an appropriate conductive material. As an example of such a conductive material, metal such as aluminum, silver, copper, or gold, or an alloy containing at least one of these metals can be given.

In the embodiment, wiring electrodes 10a are provided on the principal surface of the first sealing member 10. The wiring electrodes 10a are connected to the electrodes 21 and 23. By the wiring electrodes 10a, the electrodes of the electronic component body 20 are led outside. The wiring electrodes 10a are connected to terminal electrodes 10b. The terminal electrodes 10b are provided in cutouts at corner portions of the first sealing member 10. The wiring electrodes 10a and the terminal electrodes 10b can be formed of an appropriate conductive material. As an example of such a conductive material, metal such as aluminum, silver, copper, or gold, or an alloy containing at least one of these metals can be given.

In the embodiment, the wiring electrodes 10a and the electrodes 21 and 23 are bonded with conductive adhesive layers 12.

Next, a manufacturing method for the electronic component 1 of the embodiment will be described.

Figure 3:
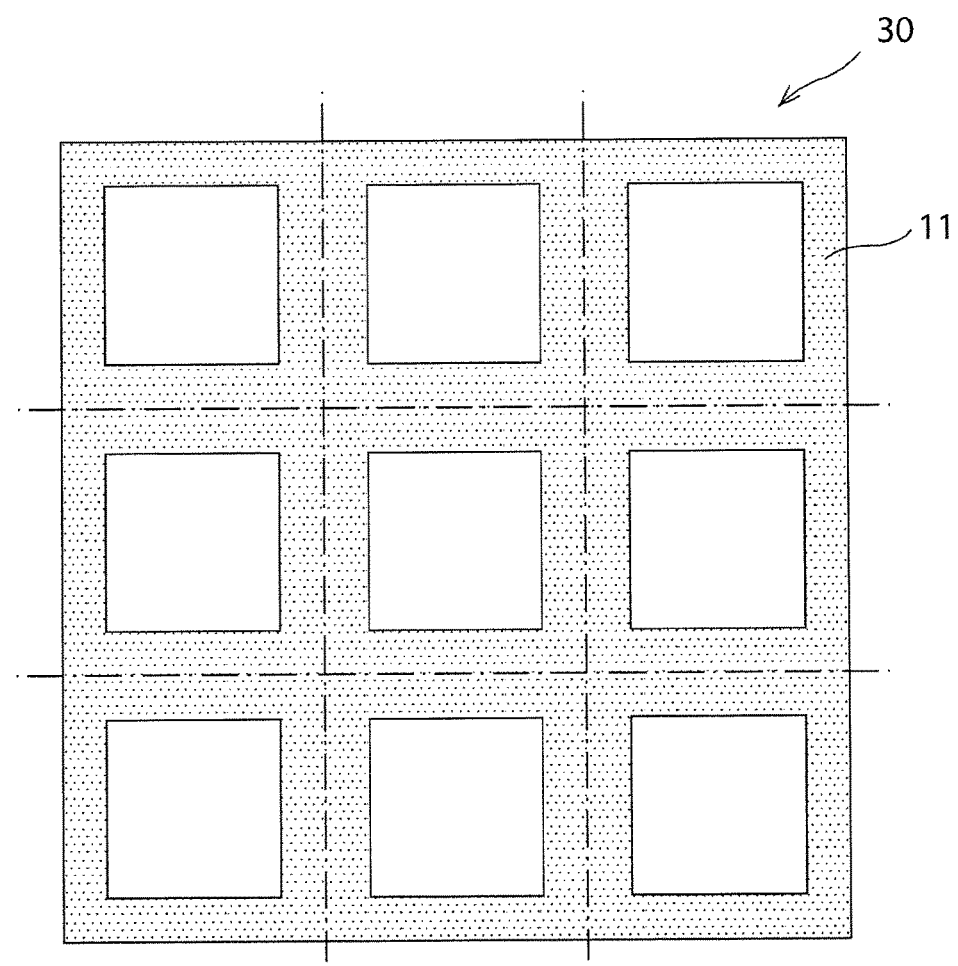
FIG. 3 is a schematic plan view of an original sealing member used in a manufacturing method for an electronic component according to an embodiment of the present invention.

First, a first sealing member 10 provided with a frame-shaped glass layer 11 is formed from an original sealing member 30. FIG. 3 is a schematic plan view of the original sealing member 30 provided with a frame-shaped glass layer 11.

Specifically, first, the original sealing member 30 is prepared. The original sealing member 30 is a member to be cut into a plurality of first sealing members 10 described above in a below-described step. For this reason, the original sealing member 30 is formed of the same material as that of the first sealing members 10. In the embodiment, the original sealing member 30 is a plate-shaped motherboard for the first sealing members 10 each formed by an alumina substrate. For this reason, the original sealing member 30 is formed by an alumina plate.

Next, a glass layer 11 is formed in a frame shape on a part of a principal surface of the original sealing member 30. A method for forming the frame-shaped glass layer 11 is not particularly limited, and for example, the glass layer 11 can be formed by being baked after printed.

When the frame-shaped glass layer 11 is formed, it is preferably formed to include frame inner regions having an area more than or equal to the area of a region surrounded by an outer peripheral edge of a second sealing member 15. This allows the second sealing member 15 to be directly bonded to the principal surface of the first sealing member 10 when the first and second sealing members 10 and 15 are bonded, as will be described below. Since a plurality of first sealing members 10 are formed from the original sealing member 30, the glass layer is preferably formed in a lattice shape on the original sealing member 30 to include a plurality of frame inner regions of the above-described size.

If the thickness of the frame-shaped glass layer 11 is too large, the glass is sometimes cracked in a below-described step of cutting the original sealing member 30. For this reason, the frame-shaped glass layer 11 is preferably formed to have a thickness of 10 μm or less.

Next, first sealing members 10 are formed by cutting the original sealing member 30. The original sealing member 30 is cut to include portions where the frame-shaped glass layer 11 is provided. Thus, a frame-shaped glass layer 11 is provided near a peripheral edge portion on a principal surface of each obtained first sealing member 10.

A method for cutting the original sealing member 30 is not particularly limited as long as it can cut the original sealing member 30 and the frame-shaped glass layer 11. For example, the original sealing member 30 can be cut with a dicing blade.

Next, an electronic component body 20 is prepared. The electronic component body 20 is mounted on the first sealing member 10. In the embodiment, the electronic component body 20 is mounted by being bonded to wiring electrodes 10a formed on a principal surface of the first sealing member 10 with conductive adhesive layers 12 being disposed therebetween. However, the electronic component body 20 may be mounted, for example, by using solder.

Next, a second sealing member 15 is prepared. Next, the second sealing member 15 is bonded in a frame formed by the frame-shaped glass layer 11 on the principal surface of the first sealing member 10 with a resin adhesive layer 13 and an isolating layer 14 being disposed therebetween. A method for bonding the first and second sealing members 10 and 15 is not particularly limited as long as the first and second sealing members 10 and 15 are bonded with the resin adhesive layer 13 being disposed therebetween. For example, the first and second sealing member 10 and 15 can be bonded by hot pressing.

An atmosphere in which the first and second sealing members 10 and 15 are bonded may be an atmospheric-pressure atmosphere or a reduced-pressure atmosphere. When the atmosphere is a reduced-pressure atmosphere, a reduced-pressure atmosphere can be formed in a sealed space 15a. The atmosphere may be an air atmosphere, a nitrogen gas atmosphere, or an argon gas atmosphere.

As described above, in the embodiment, the first and second 10 and 15 are bonded after the original sealing member 30 is cut. However, in the manufacturing method of the present invention, the first and second sealing members 10 and 15 may be bonded before the original sealing member 30. In this case, after the glass layer 11 is formed in a frame shape on the original sealing member 30, electronic component bodies 20 are mounted, and subsequently, first and second sealing members 10 and 15 are bonded. After that, the original sealing member 30 is cut.

After that, the resin adhesive layer 13 is cured, so that an electronic component 1 of the present invention is manufactured. A method for curing the resin adhesive layer 13 is not particularly limited. For example, the resin adhesive layer 13 may be cured by heating, or may be cured by being left as it is. To suppress the spread of the resin adhesive before curing, the resin adhesive layer 13 is preferably quickly cured after the first and second sealing members 10 and 15 are bonded.

In the electronic component 1 of the embodiment, the frame-shaped glass layer 11 is provided between the peripheral edge portion of the first sealing member 10 and the frame-shaped bonding region, where the resin adhesive layer 13 is provided, on the principal surface of the first sealing member 10. Hence, it is possible to provide the electronic component in which an uncured resin adhesive rarely spreads to the peripheral edge portion of the first sealing member 10. The above advantage will be described below with reference to FIGS. 4 to 6.

Figure 4:
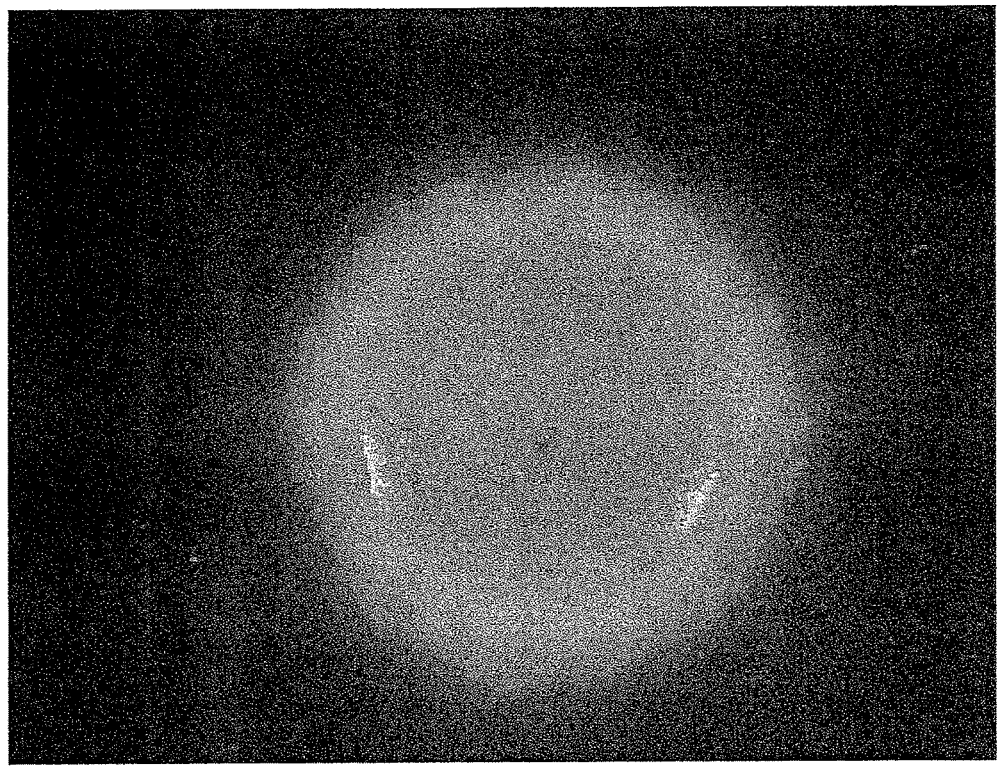
FIG. 4 is an ultraviolet photograph of a surface of a glass on which a resin adhesive is applied.
Figure 5:
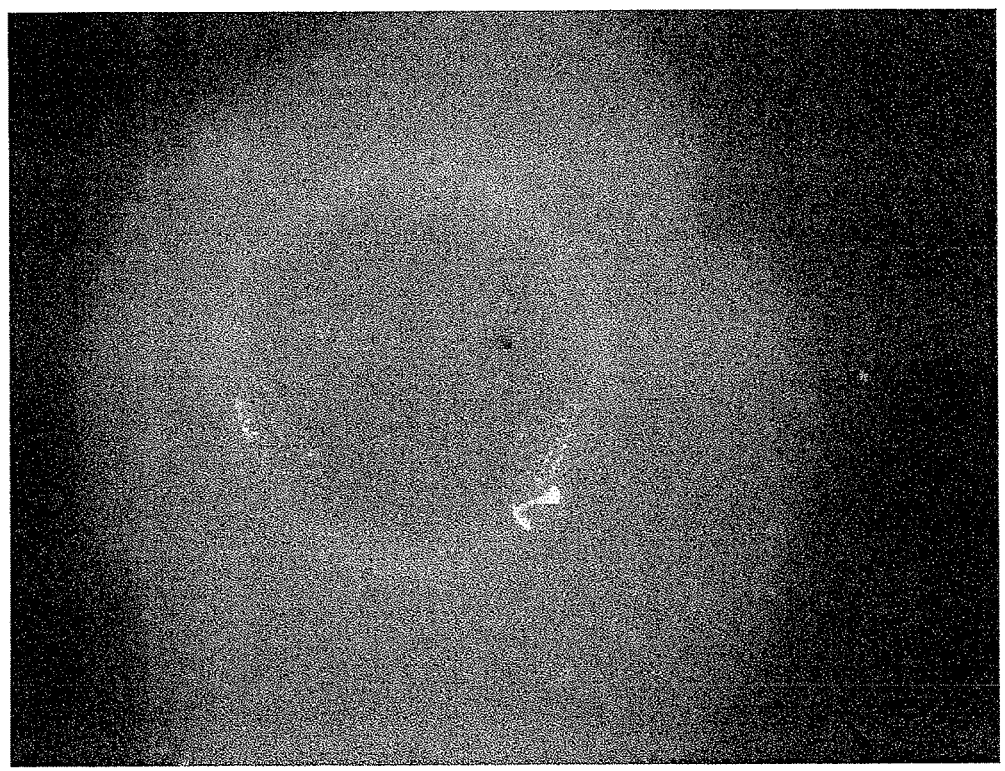
FIG. 5 is an ultraviolet photograph of a surface of an alumina substrate on which a resin adhesive is applied.

FIG. 4 is an ultraviolet photograph of a surface of a glass on which a resin adhesive is applied. FIG. 5 is an ultraviolet photograph of a surface of an alumina substrate on which a resin adhesive is applied. In the ultraviolet photographs of FIGS. 4 and 5, a bright portion represents a portion where the resin adhesive is present. In the centers of FIGS. 4 and 5, the resin adhesive is applied in a substantially circular form. On an outer side of the resin adhesive, a bleed of the applied resin adhesive is caused.

As illustrated in FIG. 5, the applied resin adhesive widely spreads on the surface of the alumina substrate. In contrast, as illustrated in FIG. 4, the applied resin adhesive spreads only near the substantially circular shape thereof. That is, the spread of the resin adhesive can be made even smaller on the surface of the glass than on the surface of the alumina substrate.

Figure 6:
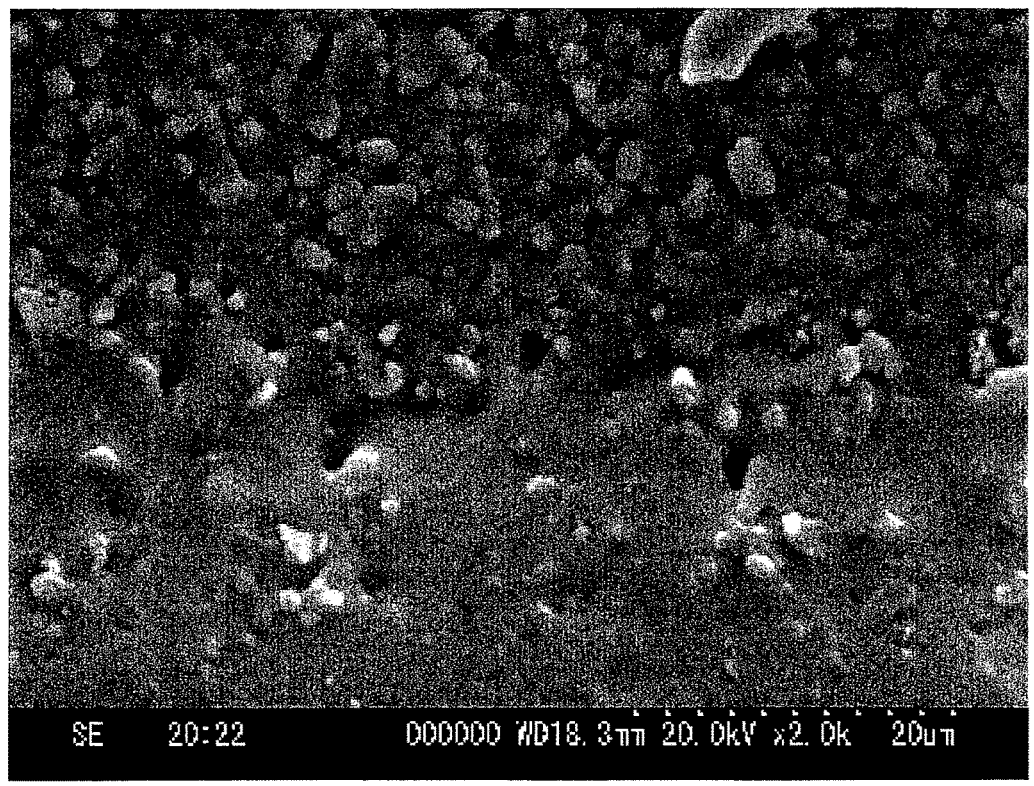
FIG. 6 is a 2000× magnified photograph of a surface of an alumina substrate, on which glass is applied, taken by a scanning electron microscope (SEM).

FIG. 6 is a 2000× magnified photograph of a surface of an alumina substrate on which glass is applied, which is taken with a scanning electron microscope (SEM). A rough surface found in an upper half of FIG. 6 is a section of the surface of the alumina substrate on which glass is not applied. A smooth surface found in a lower half of FIG. 6 is a surface of the glass applied to the alumina substrate. By thus applying glass, the surface roughness of the surface of the alumina substrate can be decreased. On the glass surface having a low surface roughness, the surface tension of the resin adhesive is high. Therefore, because of the surface tension, the resin adhesive is less likely to spread on the surface of the substrate on which the glass is applied than on the surface of the alumina substrate.

The present invention will become apparent from the following specific example of the present invention. The present invention is not limited to the following example.

Example

A piezoelectric vibration device having a structure substantially similar to that of the electronic component 1 illustrated in FIGS. 1 and 2 was manufactured in the following manner.

First, a motherboard formed of alumina was prepared as an original sealing member 30 illustrated in FIG. 3. Next, a frame-shaped glass layer having a thickness of 10 to 12 μm was formed by applying glass on a principal surface of the motherboard in a lattice form, as illustrated in FIG. 3. At this time, an area necessary to bond a below-described metal cap was left on the principal surface of the motherboard as a portion where the glass was not applied.

Next, the motherboard was cut to include the portion where the frame-shaped glass layer was applied, whereby an alumina substrate was formed as a first sealing member 10.

Next, a piezoelectric vibrator serving as an electronic component body 20 was mounted on the alumina substrate. Next, a metal cap formed of 42 nickel and serving as a second sealing member 15 was bonded in a frame defined by the frame-shaped glass layer on the principal surface of the alumina substrate by applying an epoxy resin adhesive in a frame shape and performing hot pressing.

After that, the resin adhesive was cured by heating in an oven, so that a piezoelectric vibration device was manufactured. The resin adhesive at a bonding surface between the alumina substrate and the metal cap was about 10 μm in thickness.

First Comparative Example

A piezoelectric vibration device was manufactured in a manner similar to that adopted in the example except that glass was not applied to a motherboard.

Second Comparative Example

A piezoelectric vibration device was manufactured in a manner similar to that adopted in the example except that glass was applied to the entire surface of a motherboard and an alumina substrate and a metal cap were bonded with a glass layer being disposed therebetween.

[Evaluation of Spread of Resin Adhesive]

Figure 7:
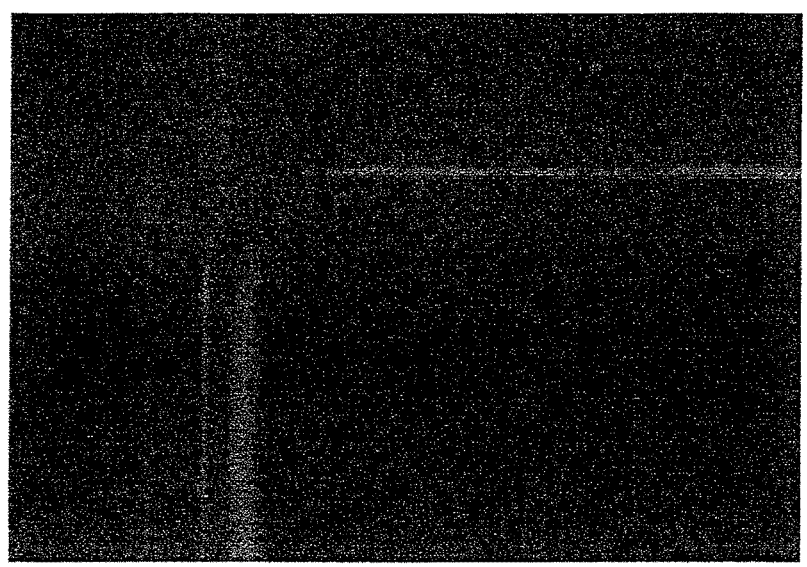
FIG. 7 is a photograph of a part of a piezoelectric vibration device manufactured in an example.
Figure 8:
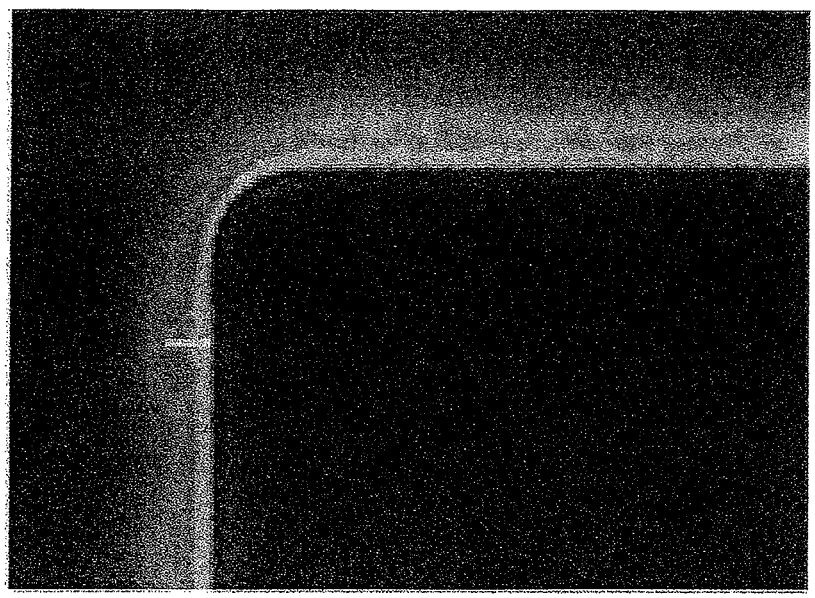
FIG. 8 is a photograph of a part of a piezoelectric vibration device manufactured in a first comparative example.

The spread of the resin adhesive in the piezoelectric vibration devices manufactured in the example and the first comparative example was checked. FIG. 7 is a fluorescence microscope photograph of a part of the piezoelectric vibration device manufactured in the example. FIG. 8 is a fluorescence microscope photograph of a part of the piezoelectric vibration device manufactured in the first comparative example. In the fluorescence microscope photographs of FIGS. 7 and 8, a right lower dark portion is the metal cap. A bright portion found around the metal cap is the resin adhesive that spreads from the bonding surface between the alumina substrate and the metal cap.

As illustrated in FIGS. 7 and 8, the spread of the resin adhesive is more sufficiently suppressed in the piezoelectric vibration device of the example than in the piezoelectric vibration device of the first comparative example. It can be considered this is because the surface tension of the resin adhesive effectively acts since the surface roughness of the frame-shaped glass layer provided near a peripheral edge portion of the alumina substrate is low. It can also be considered this is because the spread of the resin adhesive is suppressed by the difference between the thickness of the frame-shaped glass layer and the thickness of the resin adhesive layer since the thickness of the frame-shaped glass layer is more than the thickness of the resin adhesive.

[Evaluation of Bonding Strength]

A force horizontal to the metal caps in the piezoelectric vibration devices manufactured in the example and the second comparative example was gradually applied to the metal caps with a ball shear tester (Bonding Tester "PTR-1000" from Rhesca Corporation). By measuring the force by which the metal cap was separated from the alumina substrate, the bonding strength between the alumina substrate and the metal cap was measured.

As a result of the above measurement, the bonding strength was 20% lower in the piezoelectric vibration device of the second comparative example than in the piezoelectric vibration device of the example. This shows that the bonding strength decreases when the alumina substrate and the metal cap are bonded with glass being disposed therebetween. Therefore, when the glass layer is not provided at the bonding surface between the alumina substrate and the metal cap as in the piezoelectric vibration device according to the example of the present invention, the spread of the resin adhesive can be suppressed while maintaining the bonding strength between the alumina substrate and the metal cap.

REFERENCE SIGNS LIST 1 electronic component
10 first sealing member
10a wiring electrode
10b terminal electrode
11 glass layer
12 conductive adhesive layer
13 resin adhesive layer
14 isolating layer
15 second sealing member
15a sealed space
20 electronic component body
21, 23 electrode
22 piezoelectric substrate
30 original sealing member

The invention claimed is:

1. A method for manufacturing an electronic component, the method comprising:
    providing an original sealing member;
    forming a glass layer on at least a portion of a principal surface of the original sealing member;
    cutting the original sealing member into a plurality of first sealing members;
    providing a plurality of second sealing members: and
    separately bonding each of the plurality of second sealing members with a resin adhesive to a respective inner frame region defined inside the glass layer on the principal surface of a respective first sealing member of each of the plurality of first sealing members, respectively.

2. The method according to claim 1, wherein the step of forming the glass layer comprises forming the glass layer in a lattice shape on the principal surface of the original sealing member.

3. The method according to claim 1, further comprising:
    forming at least one wiring electrode on each of the respective principal surfaces of the plurality of first sealing members;
    mounting an electronic component body on each of the plurality of first sealing members; and
    bonding each electronic component body to a respective wiring electrode.

4. The method according to claim 1, further comprising curing the resin adhesive.

5. A method for manufacturing an electronic component the method comprising:
provide an original sealing member:

forming a glass layer on at least a portion of a principal surface of the original sealing member, such that the glass layer has a first surface on the principle surface of the original sealing member and a second surface opposite to the first surface;

cutting the original sealing member into a plurality of first sealing members; and bonding a plurality of second sealing members, each with a resin adhesive, to each of the respective inner frame regions on the principal surface of the plurality of first sealing members defined inside the glass layer respectively, such that each of the plurality of second sealing members do not cover the second surface of the glass layer on each of the plurality of the first sealing members, respectively.

6. The method according to claim 5, wherein the step of forming the glass layer comprises forming the glass layer in a lattice shape on the principal surface of the original sealing member.

* * * * *